United States Patent
Rice et al.

[11] Patent Number: 5,870,881
[45] Date of Patent: Feb. 16, 1999

[54] BOX CLOSING APPARATUS

[75] Inventors: Kenneth E. Rice, Dellwood; Mick Suddarth; Bryan Edwards, both of Elsberry; Derrick Roberts, O'Fallon, all of Mo.

[73] Assignee: MEMC Electronic Materials, Inc., St. Peters, Mo.

[21] Appl. No.: 883,893

[22] Filed: Jun. 27, 1997

[51] Int. Cl.[6] .................................................. B65B 61/00
[52] U.S. Cl. ............................. 53/136.4; 53/399; 53/211
[58] Field of Search .................................. 53/136.4, 399, 53/211, 118, 419, 430, 488, 485

[56] References Cited

U.S. PATENT DOCUMENTS

| | | | |
|---|---|---|---|
| 3,261,144 | 7/1966 | Weber | 53/488 |
| 3,545,163 | 12/1970 | Mahaffy et al. | 53/488 |
| 3,561,190 | 2/1971 | Derentahal | 53/136.4 |
| 3,894,379 | 7/1975 | Naggert | 53/488 |
| 4,091,919 | 5/1978 | MacLeod et al. | 206/213.1 |
| 4,129,211 | 12/1978 | Clement et al. | 206/213.1 |
| 4,171,740 | 10/1979 | Clement et al. | 206/213.1 |
| 4,461,136 | 7/1984 | Hudson et al. | 53/211 |
| 4,592,189 | 6/1986 | Martini | 53/136.4 |
| 5,077,956 | 1/1992 | Thimon | 53/399 |
| 5,129,211 | 7/1992 | Anderson | 53/399 |
| 5,184,996 | 2/1993 | Rode et al. | 53/136.4 |
| 5,351,415 | 10/1994 | Brooks et al. | 34/389 |
| 5,369,939 | 12/1994 | Moen et al. | 53/488 |
| 5,534,282 | 7/1996 | Garwood | 53/488 |
| 5,701,722 | 12/1997 | Franklin et al. | 53/399 |

*Primary Examiner*—James F. Coan
*Assistant Examiner*—Gene L. Kim
*Attorney, Agent, or Firm*—Senniger, Powers Leavitt & Roedel

[57] ABSTRACT

Box closing apparatus applies equal pressure around the joint between upper and lower portions of a box so that the portions are sealingly interconnected around the entire joint between the portions. The apparatus has upper and lower press plates between which the box is received. In addition, a tape dispenser is provided for application of tape to the joint after the upper and lower box portions are engaged. Rotation of the press plates is permitted to facilitate application of the tape to the box joint.

19 Claims, 4 Drawing Sheets

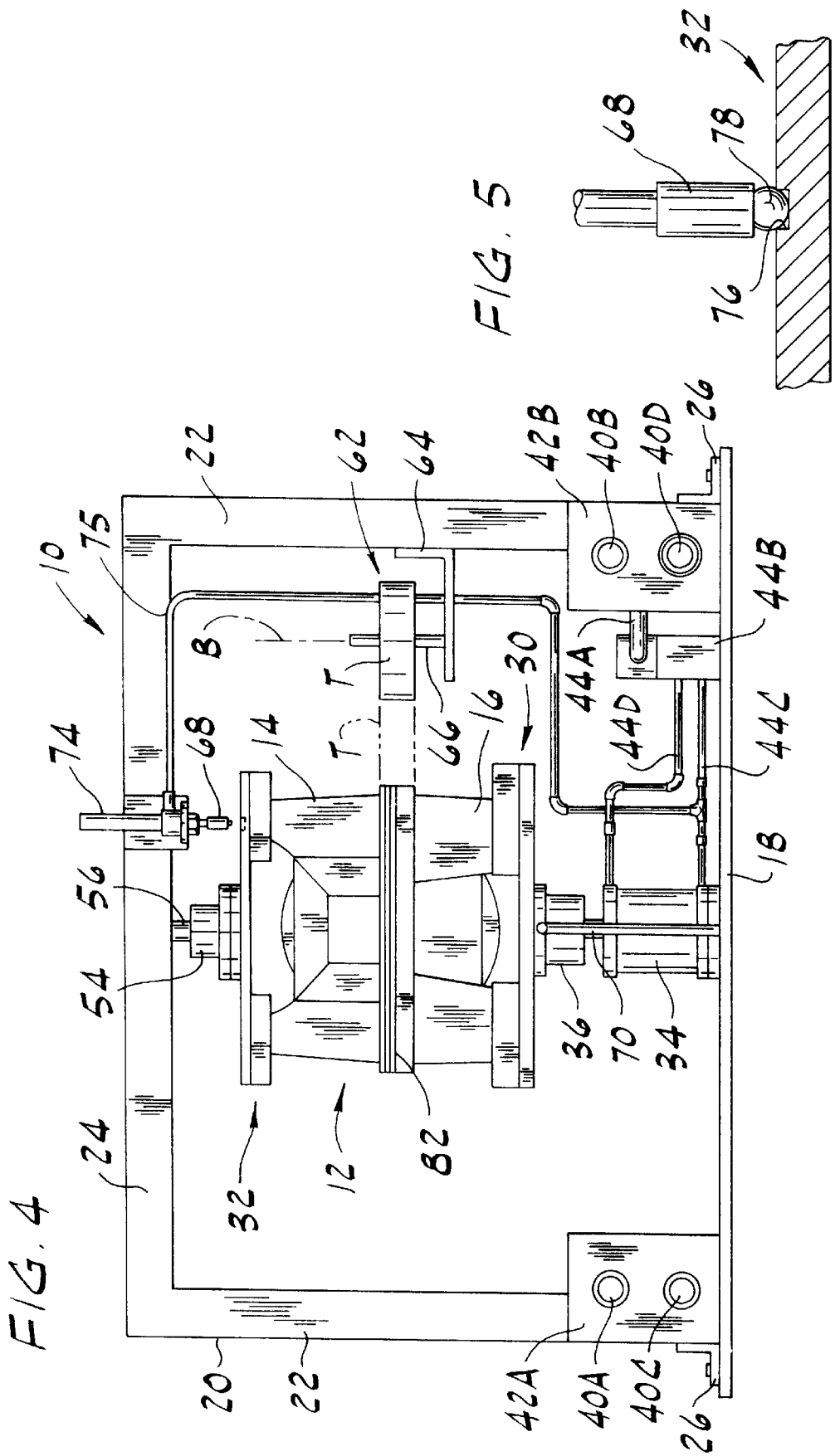

BOX CLOSING APPARATUS

BACKGROUND OF THE INVENTION

This invention relates generally to packaging of semiconductor wafers, and more particularly to a box closing apparatus for semiconductor wafer packaging.

The final stages of semiconductor wafer production are conventionally carried out in a clean room so that the finished wafers are free from particulate matter deposits and moisture. The condition of the wafers must be maintained as they are transported to a facility in another city or country. Moreover, the wafers must not be physically damaged either by the packaging process or by the rigors of their transportation.

Accordingly, specialized transportation boxes have been developed for transportation of the semiconductor wafers. Typically, these boxes contain a cassette which holds the wafers with minimal contact of the front and rear surfaces of the wafer. The wafers may be loaded into the cassette manually, or automatically by existing machinery. The loaded cassettes are manually placed in a lower portion of the box. An upper portion of the box is placed on the lower portion over the cassette and pressed down against the lower portion. The box is designed for a snap-latching interengagement of the upper and lower halves. To insure that the two halves are sealed together, tape is applied around the circumference of the box over the joint between the upper and lower halves. The box is then sealed inside a flexible, moisture barrier package (e.g., an aluminum coated acrylar polymer material).

The placement of the cassette into the wafer transport box and closing of the box are carried out by hand. To close the box after the loaded cassette is placed in the lower portion, a technician presses down on the upper portion of the box. It is often difficult to apply sufficiently even pressure of the upper portion of the box to interengage the upper and lower portions all of the way around the joint. As a result, the technician would have to take considerable time to achieve the joinder of the upper and lower portions. Occasionally, the box portions might not be fully interconnected all the way around the joint.

SUMMARY OF THE INVENTION

Among the several objects and features of the present invention may be noted the provision of apparatus for closing a semiconductor wafer box which assures a sealing closure of the box; the provision of such apparatus which closes all transport boxes in a uniform manner; the provision of such apparatus which facilitates rapid packaging of the wafers; the provision of such apparatus which facilitates taping to seal a joint on the box; the provision of such apparatus which permits accurate location of the box in the apparatus; and the provision of such apparatus which is easy to use.

A box closing apparatus of the present invention closes a box having an upper portion and a lower portion constructed for snap-latching interconnection with each other. Generally, the apparatus comprises lower press plate means constructed for supporting the transport box thereon, and upper press plate means mounted above and in generally opposed relation with the lower press plate means. Actuator means actuates relative movement of the upper and lower press plates means between an open position and a closing position. In the open position the upper and lower press plate means are spaced apart for placement of the box on the lower press plate means with the upper portion of the box resting on but unconnected to the lower portion and space between the upper portion of the box and the upper press plate means. The actuator means is constructed for relative movement of the upper and lower plate means a distance from the open position to the closing position selected to bring the upper press plate means into engagement with the upper portion of the box and to compress the upper and lower portions into snap-latching interconnection. The upper press plate means applies a downward force on the upper portion of the box which is equal in magnitude to the upward force applied to the lower portion of the box by the lower press plate means.

Other objects and features of the present invention will be in part apparent and in part pointed out hereinafter.

BRIEF DESCRIPTION OF THE DRAWINGS

FIG. 4 is the front elevational view of FIG. 3, but showing the apparatus closing the semiconductor wafer transport box;

FIG. 5 is an enlarged fragmentary cross sectional view of the apparatus showing a portion of an upper press plate and a pin received in the plate.

Corresponding reference characters indicate corresponding parts throughout the several views of the drawings.

DETAILED DESCRIPTION OF THE PREFERRED EMBODIMENT

Figure 1:
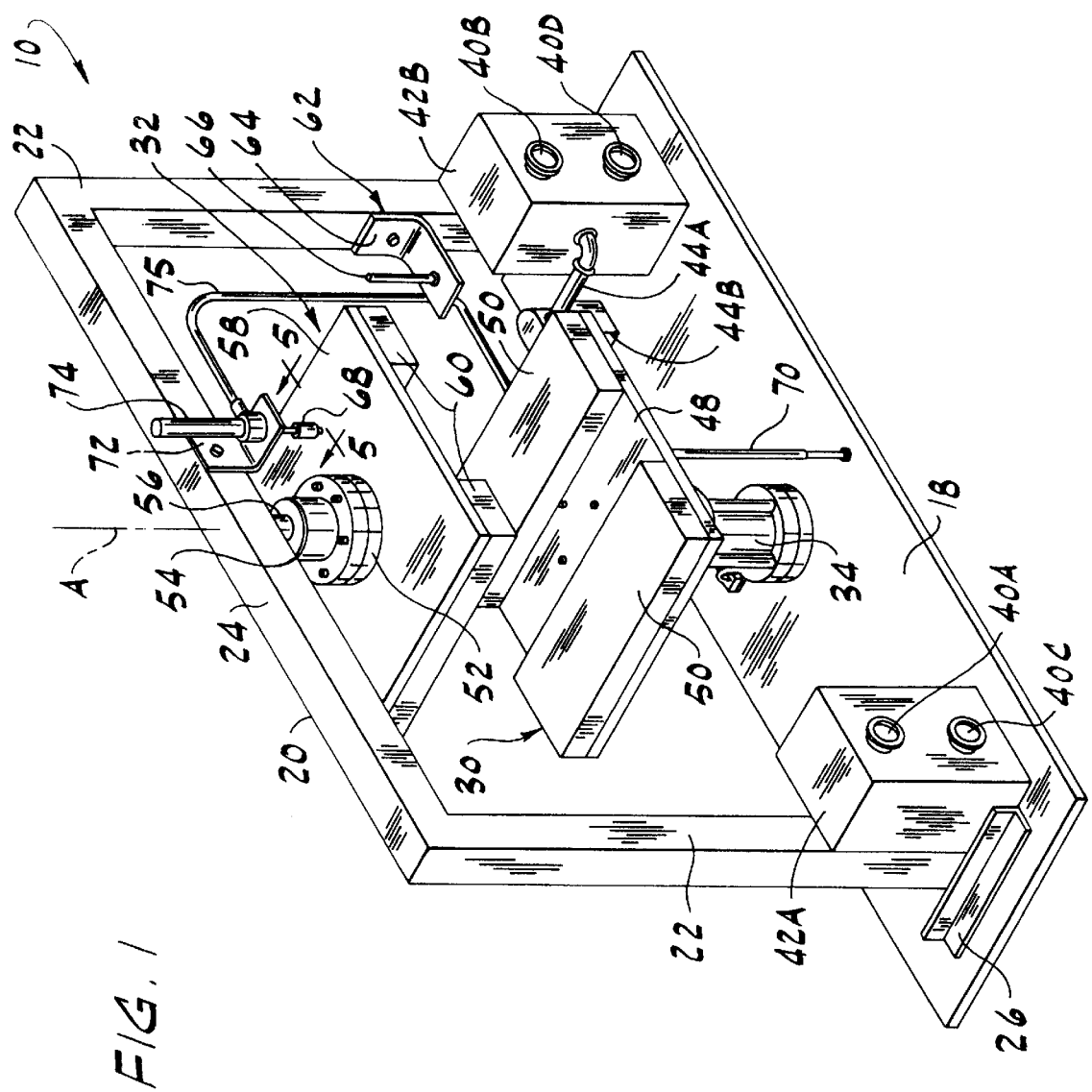
FIG. 1 is a perspective view of apparatus for closing a semiconductor transport box of the present invention.
Figure 3:
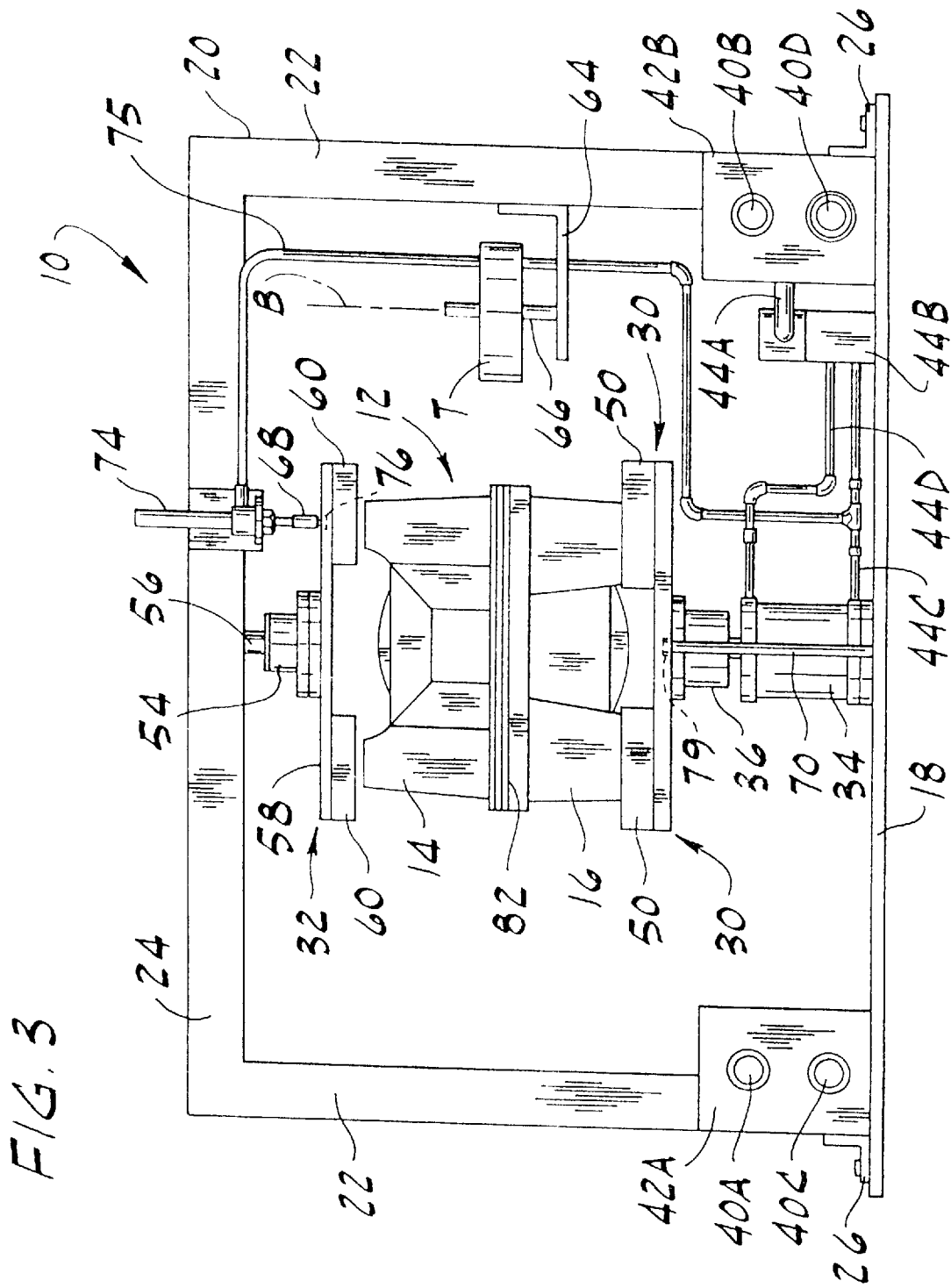
FIG. 3 is a front elevational view of the apparatus holding a semiconductor wafer transport box prior to closure of the box.

Referring now to the drawings, and in particular to FIG. 1, apparatus constructed according to the principles of the present invention is indicated generally at 10. The apparatus is constructed for closing a semiconductor wafer transport box generally indicated at 12 (FIGS. 3 and 4). Although the present invention is particularly useful in the context of semiconductor wafer transport boxes, it is envisioned that other types of snap-latching boxes could also be closed with the apparatus of the present invention.

Figure 2:
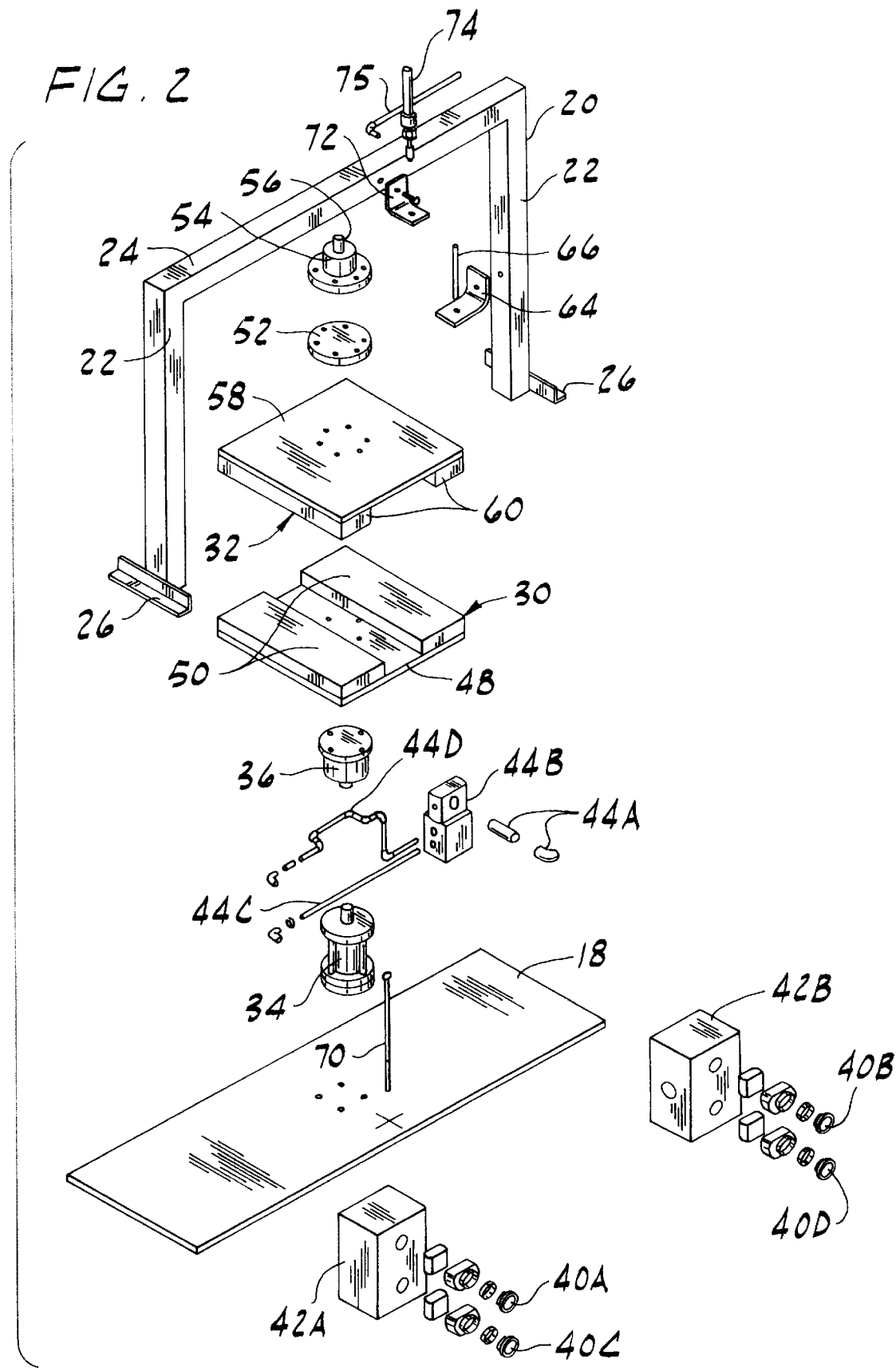
FIG. 2 is an exploded perspective view of the apparatus.

The transport box includes an upper portion 14 which is separable from a lower portion 16 of the box. The upper and lower portions are constructed for snap-latching interconnection. The apparatus 10 is constructed to operate with existing transport boxes, such as the ULTRAPAK transport box, manufactured by Empak, Inc. of Colorado Springs, Colo. The apparatus includes a base 18 and a frame 20 mounted on the base. The frame 20 comprises a pair of upright posts 22 and a cross bar 24 extending above the base 18 between the posts. The frame 20 is attached, as by welding, to the base 18. The attachment is facilitated by angle irons 26 (FIG. 2). The base 18 is preferably made of aluminum or stainless steel and the frame 20 is preferably made of stainless or non-stainless steel. Other materials may be used, so long as particle generation from the collective materials is kept down to a level acceptable for operation of the apparatus in a clean room.

The apparatus 10 further includes a lower press plate and an upper press plate (generally indicated by reference numerals 30 and 32, respectively). It is to be understood that the lower and upper press plates 30, 32 (broadly, "lower and upper press plate means") may have other constructions than depicted in the drawings. For instance, either or both of the press plates 30, 32 may not be of unitary construction.

The lower press plate 30 is mounted on the base 18 by an air cylinder 34 (broadly, "actuator means"). The actuator means may be other than an air cylinder and still fall within the scope of the present invention. For instance, a an electrical actuator (not shown) such as a solenoid might be used. The lower press plate 30 is attached to a bearing 36 which is mounted on an arm 38 of the air cylinder 34 (see FIG. 2). The air cylinder is operated by push buttons (designated by reference numerals 40A–40D) located on control boxes (designated 42A and 42B, respectively) mounted adjacent respective posts 22 of the frame 20. Simultaneous depression of the upper two buttons 40A, 40B on the two control boxes 42A, 42B causes the cylinder 34 to raise the lower press plate 30. Depression of the lower two buttons 40C, 40D lowers the lower press plate 30. A pneumatic circuit for the air cylinder 34 is not shown (being of a construction readily understood by those of ordinary skill in the art), but includes tubing 44A leading from the control box 42B to a manifold connector 44B and tubing 44C, 44D leading from the manifold connector to the air cylinder.

The bearing 36 permits the lower press plate 30 to rotate about a vertical axis A relative to the air cylinder 34 and base 18. The lower press plate 30 comprises a base plate 48 and a pair of spaced-apart, rectangular pads 50 mounted on the base plate and extending along opposite lateral edges of the base plate. The pads 50 are made of a rigid material in the preferred embodiment.

The upper press plate 32 is supported from the cross bar 24 of the frame 20 above and in a generally opposed relation with the lower press plate 30. More specifically, the upper press plate 32 is attached to a circular connector plate 52 which is mounted on a bearing 54. A shaft 56 extending from the bearing 54 is fixedly mounted on the underside of the cross bar 24, such that the upper press plate 32 is free to rotate relative to the cross bar about substantially the same vertical axis A as the lower press plate 30. The upper press plate 32 also includes a base plate 58 and a pair of spaced-apart, rectangular pads 60 mounted on the base plate. The pads 60 are made of a rigid material in the preferred embodiment.

A tape dispenser, generally indicated at 62, is mounted on the right post 22 of the frame 20. The tape dispenser is capable of holding a roll of tape T (FIGS. 3 and 4) for application to the semiconductor wafer transport box 12. The tape dispenser 62 includes a bracket 64 attached by a suitable fastener to the post 22, and a spindle 66 on which the roll of tape T is received. The roll of tape T is capable of rotating on the spindle 66 about a vertical axis B to dispense tape from the roll for use in sealing the semiconductor wafer transport box 12, as described more fully hereinafter.

Means for fixing the lower and upper press plates 30, 32 comprises in the preferred embodiment pins (designated at 68 and 70, respectively) which are capable of selective engagement with the lower and upper press plates, respectively, to fix the plates from rotation about the vertical axis A. Although pins 68, 70 are illustrated in the preferred embodiment, the fixing means could be other than shown without departing from the scope of the present invention. For example, a single member may be used to lock both plates 30, 32, or the bearings 36, 54 may be locked to prevent rotation. The pins 68, 70 also precisely locate the lower and upper press plates 30, 32 at the beginning of the operation of the apparatus 10.

The pin 68 associated with the upper press plate 32 is mounted on a bracket 72 attached to the cross bar 24 of the frame 20. The pin 68 is operable, by actuation of an air cylinder 74, to move to an extended position in which the pin is received in a recess 76 in the upper press plate 32 to fix the upper press plate against rotation about vertical axis A relative to the base 18 and frame 20 (FIG. 5). The air cylinder 74 is connected by tubing 75 branching off from tubing 44C connecting the air cylinder 34 to the manifold connector 44B. Air cylinder 75 is operable to raise the pin 68 to a retracted position in which the pin is out of the recess 76 and releases the upper press plate 32 for rotation relative to the base 18 and frame 20.

As shown in FIG. 5, the upper end of the pin 68 has a bearing 78 on its free end. The bearing 78 permits the apparatus 10 to function properly even when there is misalignment 68 of the pin with the recess 70. Should misalignment occur, the bearing 78 allows the end of the pin 68 to roll into the recess without scraping against the upper press plate 32. In practice, there will rarely be perfect alignment of the pin 68 with the recess 76 before the cylinder is activated to move the pin into the recess. In the absence of the bearing 78, the pin 68 would scrape against the upper press plate 32 as it moved into the recess, generating particles capable of becoming deposited on the wafers and damaging the apparatus 10.

The pin 70 associated with the lower press plate 30 is mounted on the base 18 and projects up from the base. The pin 70 is of a fixed length and remains in the same position. When the lower press plate 30 is lowered by the air cylinder 34 it occupies a position in which the free end of the pin 70 is received in a recess 79 (FIG. 3) in the underside of the lower press plate. The reception of the pin 70 in the recess 79 is substantially the same as for the pin 68 in the recess 76 of the upper plate 32, as shown in FIG. 5. The pin 70 has a bearing 80 (FIG. 2) at its free end to permit the pin to slide into the recess 79 without scraping the lower press plate 30.

Having described the construction of the apparatus 10, the operation of the apparatus will now be described, with reference being made of FIGS. 3 and 4 of the drawings. Finished semiconductor wafers are loaded into cassettes by conventional techniques and machinery. The cassettes are then placed in the lower portion 16 of the semiconductor wafer transport box 12. The upper portion 14 of the transport box 12 is placed on the lower portion 16 over the cassette, but the upper and lower portions are not interconnected. The transport box 12 is placed onto the lower press plate 30 of the apparatus 10 as shown in FIG. 3, with a portion of the box known as the H-bar facing outward toward the technician. The lateral edge margins of the lower portion 16 rest on the pads 50 of the lower press plate 30. A central portion of the box 12, in which the wafers are located closest to the outer wall of the box, does not engage the lower press plate 30. The lower and upper press plates 30, 32 are in an open position in FIG. 3 in which the press plates are spaced apart a distance greater than the height of the transport box 12 so that the box can be easily placed between the press plates. In this position, a joint 84 between the upper and lower portions 14, 16 of the transport box 12 is located slightly below the level of the roll of tape T held by the tape dispenser 62.

The technician simultaneously depresses the top buttons 40A, 40B on the control boxes 42A, 42B. As shown in FIG. 4, the air cylinder 34 extends to raise the lower press plate 30, lifting the semiconductor wafer transport box 12 so that the upper portion 14 of the box engages the upper press plate 32 in a closing position of the apparatus 10. More particularly, the upper portion 14 engages the pads 60 of the upper press plate 32 along opposite lateral sides of the box 12. The central portion of the transport box 12, where the wafer are most closely proximate to the outer wall of the box, does not engage the upper press plate 32. The upper press plate applies a reaction force to the upper portion 14 of the transport box 12 which is equal in magnitude and opposite in direction to the force applied by the lower press plate 30 to the lower portion 16 of the transport box. The force is applied uniformly over the parts of the transport box 12 engaging the pads 50, 60. The even application of force between the upper and lower portions 14, 16 of the box 12 permits the portions to snap together around the full circumference of the box. Thus, the transport box 12 is fully sealed.

The activation of the air cylinder 34 by depressing the buttons 40A, 40B, also activates the air cylinder 74 to move the pin 68 upward and release the upper press plate 32. The upper press plate is now free to rotate about the vertical axis A relative to the base 18 and frame 20. Moreover as the air cylinder 34 raises the lower press plate 30, the plate moves off of the pin 70 so that the lower press plate is free to rotate about the vertical axis A. The clamping action of the lower and upper press plates 30, 32 against the semiconductor wafer transport box 12 fixes the lower and upper press plates and the box to move conjointly about the vertical axis A.

As shown in FIG. 4, the joint 82 between the upper and lower portions 14, 16 is substantially on level with the roll of tape T held by the tape dispenser 62 in the closing position of the apparatus 10. The technician pulls tape from the roll T, as indicated by the phantom lines shown in FIG. 4, and adheres the free end of the tape to the back side of the transport box 12. The box (along with the lower and upper press plates 30, 32) is then rotated, causing more tape to be pulled off of the roll T. The tape is pressed against the joint 82 and the transport box 12 is rotated until the entire joint is covered with tape. The alignment of the joint 82 with the tape dispenser 62 facilitates an symmetric placement of the tape on the upper and lower portions 14, 16 of the transport box 12 all the way around the joint. In the preferred embodiment, the transport box 12 is rotated through about 1¼ turns. The tape is cut from the roll T and some of the excess tape is folded under itself to form a pull tab to facilitate opening the transport box 12 when it reaches its final destination.

The technician rotates the taped semiconductor wafer transport box 12 back to its original orientation. The lower buttons 40C, 40D on the control boxes 42A, 42B are simultaneously depressed, causing the air cylinder 34 to lower the lower press plate 30. In the open position, the transport box 12 can be slid out from between the lower and upper plates 30, 32 to remove it from the apparatus 10. The transport box 12 is then placed in a flexible, moisture barrier bag (not shown) before it is ready for delivery.

Depression of the lower buttons 40C, 40D also activates air cylinder 74 to extend the pin 68 into the recess 76 on the upper press plate 32. The free end of the pin 68 may engage the lower press plate 30 to one side of the opening because of a misalignment of the recess 76 with the pin. However, the bearing 78 on the end of the pin 68 will permit the pin to slide into the recess 76 without scraping against the upper press plate 32. As the lower press plate 30 drops down from the closing position, the plate moves onto the pin 70 projecting up from the base 18. The bearing 80 on the end of the pin 70 facilitates entry of the pin into the recess of the lower plate 30 without particle generation. Once the pins 68, 70 are again received in their respective recesses, the lower and upper press plates 30, 32 are again held from rotation about the vertical axis A. The apparatus 10 is now ready to receive another semiconductor wafer transport box for closing.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A box closing apparatus for closing a box having a lid and a bottom constructed for snap-latching interconnection with each other, the apparatus comprising:

lower press plate means constructed for supporting the transport box thereon;

said lower press Plate means comprising a pair of spaced apart pads positioned for engagement with opposite lateral edge margins of the bottom of the box such that a central region of the bottom of the box remains unsupported and free of engagement with said lower press plate means; upper press plate means mounted above and in generally opposed relation with said lower press plate means;

actuator means for actuating relative movement of said upper and lower press plate means between an open position and a closing position, in the open position said upper and lower press plate means being spaced apart for placement of the box on said lower press plate means with the lid of the box resting on but unconnected to the bottom and space between the lid of the box and said upper press plate means;

said actuator means being constructed for relative movement of said upper and lower plate means a distance from the open position to the closing position selected to bring said upper press plate means into engagement with the lid of the box and to compress the lid and bottom into snap-latching interconnection, said upper press plate means applying a downward force on the lid of the box which is equal in magnitude to the upward force applied to the bottom of the box by said lower press plate means.

2. Apparatus as set forth in claim 1 wherein said actuator means comprises a riser supporting said lower press plate means and capable of raising and lowering said lower press plate means between said open and closing positions.

3. Apparatus as set forth in claim 2 wherein said upper press plate means comprises a base plate and a pair of spaced apart pads mounted on the base plate such that a central region of the lid of the box remains unsupported free of engagement with the pads, the pads being in generally opposed relation with respective ones of the pads of said lower press plate means.

4. Apparatus as set forth in claim 1 further comprising a tape dispenser disposed for holding a roll of sealing tape generally on level with a joint between the lid and bottom of the box on said lower press plate means.

5. Apparatus as set forth in claim 4 wherein said upper and lower press plate means are mounted for rotation about a generally vertical axis to facilitate application of tape over the entire joint between the lid and bottom of the box.

6. Apparatus as set forth in claim 5 further comprising means for selectively fixing said upper and lower press plate means from rotation about the vertical axis.

7. Apparatus as set forth in claim 6 wherein said fixing means comprises a first fixing device associated with said upper press plate means and a second fixing device associated with said lower press plate means, the first and second fixing devices being constructed and arranged for engaging said upper and lower press plate means, respectively, in said closing position, and for disengaging said upper and lower plate means, respectively, in said open position to permit rotation of said upper and lower press plate means about the vertical axis.

8. Apparatus as set forth in claim 7 wherein the first fixing device comprises a pin and a cylinder operable to move the pin between an extended position in which the pin is engaged with said upper press plate means to fix said upper press plate means from rotation about the vertical axis, and a retracted position in which the pin releases said upper press plate means for rotation about the vertical axis.

9. Apparatus as set forth in claim 7 wherein said actuator means comprises a riser supporting said lower press plate means and capable of raising and lowering said lower press plate means between said open and closing positions, and wherein the second fixing device comprises a pin sized and located for engagement with said lower press plate means when the riser lowers said lower press plate means and disengagement with said lower press plate means when the riser raises said lower press plate means to permit rotation of said lower press plate means about the vertical axis.

10. Apparatus as set forth in claim 7 wherein:
the first fixing device comprises a pin and a cylinder operable to move the pin between an extended position in which the pin is engaged with said upper press plate means to fix said upper press plate means from rotation about the vertical axis, and a retracted position in which the pin releases said upper press plate means for rotation about the vertical axis;

said actuator means comprises a riser supporting said lower press plate means and capable of raising and lowering said lower press plate means between said open and closing positions;

the second fixing device comprises a pin sized and located for engagement with said lower press plate means when the riser lowers said lower press plate means and disengagement with said lower press plate means when the riser raises said lower press plate means to permit rotation of said lower press plate means about the vertical axis.

11. Apparatus as set forth in claim 10 wherein the pin of the first fixing device has a bearing attached to it for sliding into engagement with said upper press plate means without generating particles, and wherein the pin of the second fixing device has a bearing attached to it for sliding into engagement with said lower press plate means without generating particles.

12. A box closing and taping apparatus for use in closing and taping a semiconductor wafer transport box having a lid and a bottom, the lid and bottom being constructed for snap-latching interconnection with each other, the apparatus comprising:

a lower press plate mounted for rotation about a vertical axis;

an upper press plate mounted above and in generally opposed relation with the lower press plate for rotation generally about the vertical axis;

actuator means for actuating relative movement of the upper and lower press plates between an open position in which the transport box is receivable between the upper and lower press plates with the lid of the transport box resting on but unconnected to the bottom and space between the lid of the transport box and the upper press plate, and a closing position in which the upper and lower press plates are closer together for causing snap-latching interconnection of the lid and bottom;

a tape dispenser arranged for holding a roll of sealing tape generally on level with a joint between the lid and bottom of the transport box in the closing position, the upper and lower press plates being rotatable for application of tape around the full length of the joint between the upper and lower portions.

13. Apparatus as set forth in claim 12 wherein said actuator means comprises a riser supporting the lower press plate and capable of raising and lowering the lower press plate between said open and closing positions.

14. Apparatus as set forth in claim 13 wherein the lower press plate comprises a pair of spaced apart pads engageable with opposite lateral edge margins of the semiconductor wafer transport box such that a central region of the transport box remains free of engagement with the lower press plate.

15. Apparatus as set forth in claim 14 wherein the upper press plate comprises a pair of spaced apart pads mounted on the upper press plate such that a central region of the lid of the box remains unsupported free of engagement with the pads, the pads on the upper press plate being in generally opposed relation with respective ones of the pads of the lower press plate.

16. Apparatus as set forth in claim 13 further comprising means for selectively fixing the upper and lower press plates from rotation about the vertical axis.

17. Apparatus as set forth in claim 16 wherein said fixing means comprises a first fixing device associated with the upper press plate and a second fixing device associated with a lower press plate, the first and second fixing devices being constructed and arranged for engaging the upper and lower press plates, respectively, in said open position, and for disengaging the upper and lower plates, respectively, in said closing position to permit rotation of the upper and lower press plates about the vertical axis.

18. Apparatus as set forth in claim 17 wherein:
the first fixing device comprises a pin and a cylinder operable to move the pin between an extended position in which the pin is engaged with the upper press plate to fix the upper press plate from rotation about the vertical axis, and a retracted position in which the pin releases the upper press plate for rotation about the vertical axis; and the second fixing device comprises a pin sized and located for engagement with the lower press plate when the riser lowers the lower press plate and disengagement with the lower press plate when the riser raises the lower press plate to permit rotation of the press plate about the vertical axis.

19. Apparatus as set forth in claim 18 wherein the pin of the first fixing device has a bearing attached to it for sliding into engagement with the upper press plate without generating particles, and the pin of the second fixing device has a bearing attached to it for sliding into engagement with the lower press plate without generating particles.

* * * * *

UNITED STATES PATENT AND TRADEMARK OFFICE
CERTIFICATE OF CORRECTION

PATENT NO : 5,870,881
DATED : February 16, 1999
INVENTOR(S): Kenneth E. Rice et al.

It is certified that error appears in the above-identified patent and that said Letters Patent is hereby corrected as shown below:

Column 6, claim 1, line 16, "press Plate" should read ---press plate---.

Column 8, claim 12, line 13, "between the upper and lower portions" should read --between the bottom and lid--.

Signed and Sealed this

Twenty-eighth Day of September, 1999

Attest:

Q. TODD DICKINSON

Attesting Officer

Acting Commissioner of Patents and Trademarks